(12) United States Patent
Charbuillet et al.

(10) Patent No.: US 9,000,785 B2
(45) Date of Patent: Apr. 7, 2015

(54) TRANSISTOR TEST STRUCTURE

(75) Inventors: Clement Charbuillet, Chambery (FR); Patrick Scheer, Saint Martin d'Heres (FR)

(73) Assignee: STMicroelectronics SA, Montrouge (FR)

( * ) Notice: Subject to any disclaimer, the term of this patent is extended or adjusted under 35 U.S.C. 154(b) by 309 days.

(21) Appl. No.: 13/557,577

(22) Filed: Jul. 25, 2012

(65) Prior Publication Data

US 2013/0027066 A1 Jan. 31, 2013

(30) Foreign Application Priority Data

Jul. 26, 2011 (FR) ...................................... 11 56802

(51) Int. Cl.
*G01R 31/317* (2006.01)
*G01R 31/40* (2014.01)
*G01R 31/02* (2006.01)
*G01R 31/26* (2014.01)
*H01L 21/66* (2006.01)

(52) U.S. Cl.
CPC ............ *G01R 31/2644* (2013.01); *H01L 22/34* (2013.01)

(58) Field of Classification Search
CPC ........... G01R 31/2608; G01R 31/2621; G01R 31/261; G01R 31/26; G01R 31/275; G01R 31/2623; G01R 31/2884; G01R 1/0408; G01R 31/31924; G01R 1/04; G01R 1/07378; G01R 33/025; G01R 33/072; G01R 33/091
USPC ............. 438/18; 257/48; 324/750.01, 762.05, 324/719, 71.5, 71.1, 750.16, 750.26, 756.01
See application file for complete search history.

(56) References Cited

U.S. PATENT DOCUMENTS

| | | | | |
|---|---|---|---|---|
| 3,689,838 | A | * | 9/1972 | Thurman, Jr. ............ 324/762.08 |
| 5,286,656 | A | * | 2/1994 | Keown et al. ................... 438/18 |
| 6,472,233 | B1 | | 10/2002 | Ahmed et al. |
| 6,714,031 | B2 | * | 3/2004 | Seki ......................... 324/762.05 |
| 7,472,322 | B1 | * | 12/2008 | Ma et al. ........................ 714/724 |
| 2002/0047724 | A1 | | 4/2002 | Marshall et al. |
| 2003/0006413 | A1 | * | 1/2003 | Chawla et al. .................. 257/48 |
| 2004/0188678 | A1 | | 9/2004 | Wieczorek et al. |
| 2005/0184742 | A1 | | 8/2005 | Huang et al. |

FOREIGN PATENT DOCUMENTS

EP 0605812 A1 7/1994

* cited by examiner

*Primary Examiner* — Patrick Assouad
*Assistant Examiner* — Taqi Nasir
(74) *Attorney, Agent, or Firm* — Allen, Dyer, Doppelt, Milbrath & Gilchrist, P.A.

(57) ABSTRACT

A test structure may characterize the properties of a transistor including a DC test structure for testing DC properties of the transistor, and an AC test structure for testing AC properties of the transistor. The DC and AC test structures may have common test pads.

20 Claims, 4 Drawing Sheets

TRANSISTOR TEST STRUCTURE

FIELD OF THE INVENTION

The present invention relates to a method and a structure for characterizing the properties of a transistor.

BACKGROUND OF THE INVENTION

Integrated circuits fabricated in semiconductor substrates generally comprise millions of transistors for the processing of analog or digital signals. MOS transistors comprise heavily doped N or P type regions forming a source and a drain within an oppositely doped P or N type substrate or well, which may be biased by a body terminal. A thin layer of silicon dioxide $SiO_2$, or else a stack of dielectric materials, covers the area between the source and drain. A gate is formed on top of the silicon dioxide layer to control a channel extending between the source and drain.

The properties of a transistor include different physical parameters, such as a gate oxide thickness, doping levels, the length and width of the gate, and the materials used to fabricate the transistor. With advances in technology, such properties are often modified to obtain faster operation, smaller transistor size, less power-consumption, etc. However, once the transistors are fabricated, these properties may differ from those expected, and undesired effects may also result, such as an increased parasitic capacitance due to a thinner insulating oxide between the gate and the semiconductor substrate.

Thus, before implementing a new prototype transistor in production integrated circuits, it may be first necessary to characterize its properties so that it may be accurately modeled in a component library for future use. To that effect, "test structures" are commonly used to characterize the properties of the transistor.

For illustrative purposes, FIG. 1 shows a semiconductor wafer 1 comprising a plurality of transistor test structures 2, each comprising a plurality of prototype transistors (not shown) electrically linked to test pads Pi. The properties of transistors within a test structure 2 are essentially identical, while they vary from one test structure to the next. To characterize these properties, the semiconductor wafer is placed in a test apparatus, where the transistors undergo direct current (DC) and alternating current (AC) electrical tests.

FIG. 2 is a circuit diagram showing in detail a typical test structure 2. The test structure 2 comprises a DC test structure 2-1 and an AC test structure 2-2. Test structure 2-1 comprises transistors TDC1, TDC2 . . . TDCM and pads P1, P2, P3, P4. Test structure 2-2 comprises transistors TAC1, TAC2 . . . TACN and pads P5, P6, P7. Transistors TAC and TDC are assumed to be identical and to have been fabricated by the same process steps.

Transistor TDC1 has a drain D linked to pad P1, a gate G linked to pad P2, a source S linked to pad P3, and a body B linked to pad P4. The other transistors TDC2-TDCM are not linked to the pads and form conformity transistors with respect to transistor TDC1. By conformity transistors, it is meant that such transistors are merely fabricated to ensure a good conformity of transistor TDC1 to the design specifications, because it is difficult to fabricate a single isolated transistor that meets the desired specifications. Indeed, many processing steps involved in the fabrication, such as photolithographic patterning, etching, or chemical mechanical polishing, are sensitive to pattern density and/or pattern proximity effects. Thus, the features (material thickness, critical dimensions) of an isolated transistor would be different from the features of a similar transistor having neighboring transistors. Many other transistors are therefore fabricated near the transistor of interest.

Transistors TAC1-TACN have their sources S and drains D interconnected and linked to pad P5, their gates G linked to pad P6, and their bodies B linked to pad P7. Since the source S and drain D of each transistor are short-circuited, each transistor is equivalent to a "MOS capacitor." The number of interconnected transistors provided in the test structure 2-2 depends on the size of the transistor, and can vary from tens to thousands of transistors.

Such a test structure 2 has the drawback of occupying a large area on the substrate surface. In particular, the surface of the pads is currently on the order of 100×100 microns, with a minimum distance of 100 microns between two pads. The surface area and distance between pads cannot be easily reduced since the pads should be accessible to the probe tips of a probe card. Consequently, the pad size dictates the size of the test structures, and thus determines how many test structures can be provided on a semiconductor wafer. It may be desired to provide a DC and AC test structure that occupies a smaller area on a semiconductor wafer.

SUMMARY OF THE INVENTION

An aspect is directed to a test structure for characterizing the properties of a transistor. The test structure may comprise a DC test structure for testing DC properties of the transistor and comprising first test pads, at least a first transistor coupled to the first test pads, and a group of conformity transistors to ensure conformity of the first transistor to design specifications, and an AC test structure for testing AC properties of the transistor and comprising second test pads and transistors coupled to the second test pads. The DC and AC test structures may have common test pads forming both first and second test pads.

According to one embodiment, the group of conformity transistors of the DC test structure may include transistors of the AC test structure. The transistors may be MOS transistors having source, drain, and gate terminals, and the transistors of the AC test structure may have their sources and drains terminals interconnected.

In some embodiments, the transistors may be bipolar transistors with collector, base, and emitter terminals, and the transistors of the AC test structure may have their collector and emitter terminals interconnected. The test structure may comprise a test pad coupled to control terminals of the transistors of the first and second test structures.

According to one embodiment, the test structure may comprise a test pad coupled to conduction terminals of the transistors of the first and second test structures. The test structure may comprise a test pad coupled to a body terminal of the transistors of the first and second test structures.

Another aspect is directed to a semiconductor wafer comprising at least one test structure according to one of the embodiments disclosed above. Embodiments also relate to a method of characterizing the properties of a transistor. This method may comprise providing a semiconductor wafer comprising transistors arranged in at least one test structure according to one of the embodiments disclosed above, placing the semiconductor wafer in a test apparatus, connecting the test apparatus to test pads of the test structure, and applying a DC test program to the test structure, and then applying an AC test program to the test structure.

BRIEF DESCRIPTION OF THE DRAWINGS

Embodiments of the present invention will now be described in connection with, but not limited to, the appended drawings in which.

DETAILED DESCRIPTION OF THE PREFERRED EMBODIMENTS

Figure 1:
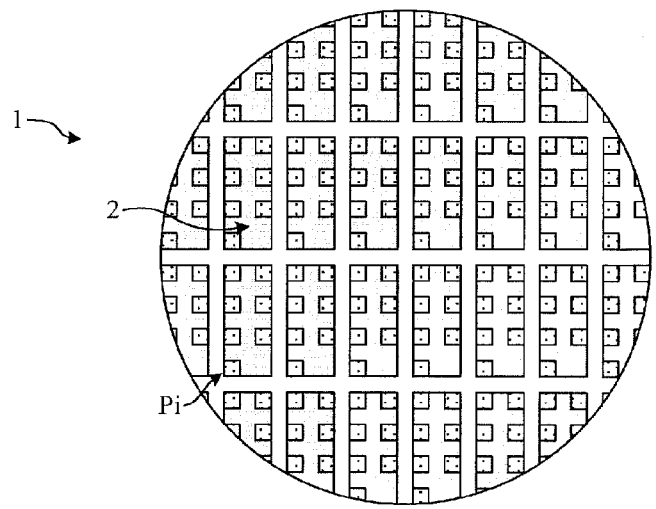
FIG. 1 shows a semiconductor wafer comprising a plurality of test structures, according to the prior art.
Figure 2:
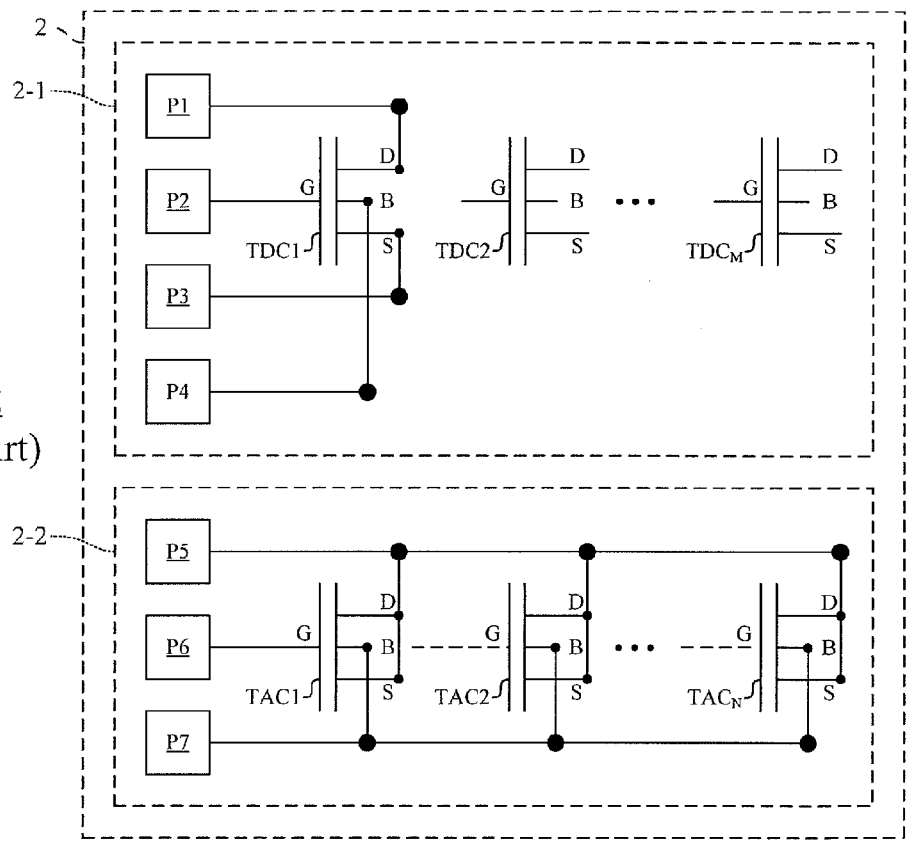
FIG. 2 is a circuit diagram of a test structure, according to the prior art.
Figure 3:
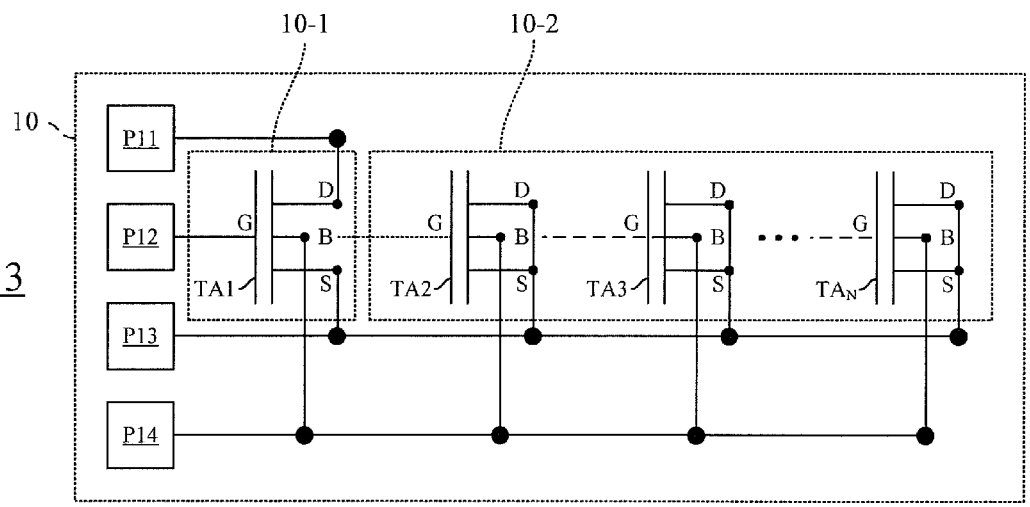
FIG. 3 is a circuit diagram of a test structure, according to a first embodiment of the present invention.

FIG. 3 is a circuit diagram of a test structure 10 according to a first embodiment. Test structure 10 comprises a DC test structure 10-1, an AC test structure 10-2, and test pads P11, P12, P13, P14. The DC and AC test structures 10-1, 10-2 comprise NMOS prototype transistors TA, i.e. metal-oxide-semiconductor field effect transistor with an N-channel in a P-well or P-substrate. Each transistor has a gate (control terminal), a source, a drain (conduction terminals), and a body terminal connected to its substrate.

The DC test structure 10-1 comprises a transistor TA1 having its drain D coupled or linked to pad P11, its gate G linked to pad P12, its source S linked to pad P13, and its body terminal linked to pad P14. The AC test structure 10-2 comprises transistors TA2, TA3 . . . TAN having their gates G linked to pad P12, their sources S and drains D linked to pad P13, and their body terminals B linked to pad P14. Therefore, pads P12, P13, P14 are common to test structures 10-1, 10-2, which allow the number of necessary test pads and thus the area occupied by the test pads to be reduced.

In addition, transistors TA2-TAN of AC test structure 10-2 form conformity transistors with respect to transistor TA1 of DC test structure 10-1, to ensure conformity of transistor TA1 to design specifications. Thus, test structure 10-1 does not require additional conformity transistors and the area occupied by transistors themselves is reduced by almost 50%.

Figure 4:
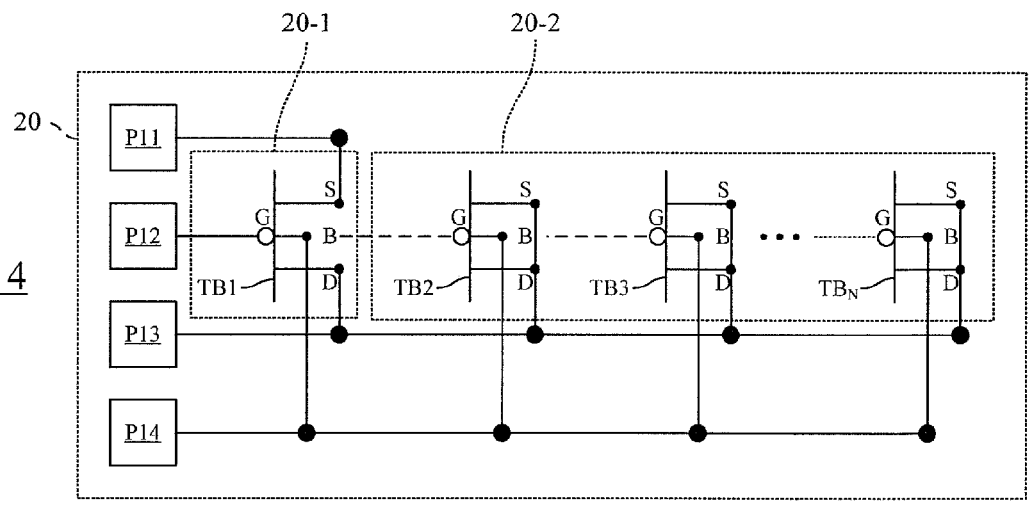
FIG. 4 is a circuit diagram of a test structure, according to a second embodiment of the present invention.

FIG. 4 shows a variant 20 of test structure 10 in which the NMOS transistors TA are replaced by PMOS transistors TB, i.e. transistors with a P-channel in an N-well or N-substrate. Test structure 20 comprises a DC test structure 20-1 and an AC test structure 20-2. The DC test structure 20-1 comprises a transistor TB1 having its source S linked to pad P11, its gate G linked to pad P12, its drain D linked to pad P13, and its body terminal linked to pad P14. The AC test structure 20-2 comprises transistors TB2, TB3 . . . TBN having their gates G linked to pad P12, their sources S and drains D linked to pad P13, and their body terminals B linked to pad P14. Transistors TB2 to TBN also form conformity transistors with respect to transistor TB1 of test structure 20-1.

Figure 5:
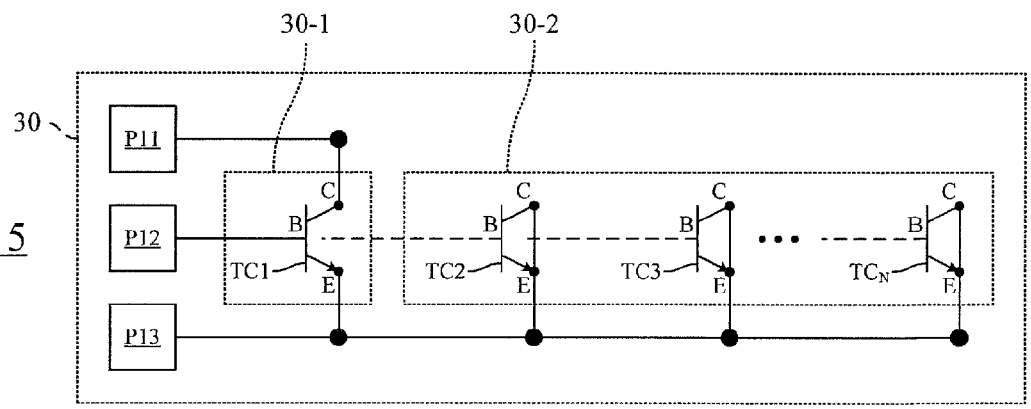
FIG. 5 is a circuit diagram of a test structure, according to a third embodiment of the present invention.

FIG. 5 shows another variant 30 of test structure 10 in which the NMOS transistors TA are replaced by bipolar prototype transistors TC, here NPN transistors. Each transistor comprises a base B (control terminal), here a p-doped substrate, an n-doped collector C, and an n-doped emitter E (conduction terminals). Test structure 30 comprises test pads P11, P12, P13, a DC test structure 30-1, and an AC test structure 30-2. The DC test structure 30-1 comprises a transistor TC1 having its collector C linked to pad P11, it base B linked to pad P12, and its emitter E linked to pad P13. The AC test structure 30-2 comprises transistors TC2, TC3 . . . TCN, which have their bases linked to pad P12, their collectors C and emitters E linked to pad P13.

Figure 6:
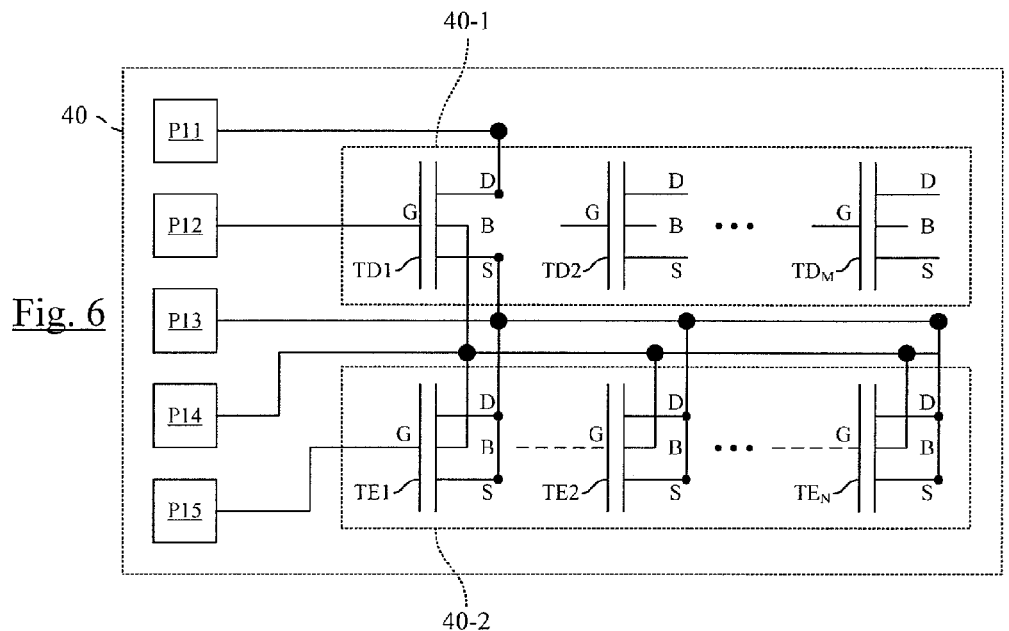
FIG. 6 is a circuit diagram of a test structure, according to a fourth embodiment of the present invention.

FIG. 6 is a circuit diagram of another example of a test structure 40. Test structure 40 comprises a DC test structure 40-1, an AC test structure 40-2, and test pads P11, P12, P13, P14, P15. The DC test structure 40-1 comprises NMOS transistors TD1, TD2 . . . TDM. Transistor TD1 has its drain linked to pad P11, its gate linked to pad P12, its source linked to pad P13, and its body linked to pad P14. The other transistors TD2-TDM are not electrically linked to the pads and are merely provided as conformity transistors. The AC test structure 40-2 comprises NMOS transistors TE1, TE2 . . . TEN. These transistors have their drains and sources linked to pad P13, their bodies linked to pad P14, and their gates linked to pad P15.

The skilled person will appreciate that the test structure according to the present embodiments has other embodiments. For example, the DC and AC test structures may have only one pad in common, for example, the pad linked to the body, or the pad linked to the sources and drains of the transistors of the AC test structure and to the source or drain of the transistor of the DC test structure. The body terminals B may be linked to the sources S of the transistors, and pad P14 not provided. The sources and drains of the transistors of the AC test structures may be linked to separate test pads.

In particular, the present embodiments can be applied to silicon-on-insulator (SOI) transistors, such as a floating body SOI with drain, gate, source and back side of the wafer pads; a body-contacted SOI with drain, gate, source, back side, and body pads; or a bulk SOI with drain, gate, source, and body pads. An isolated MOS structure may have additional pads, such as one for isolation, and one for the substrate.

Figure 7:
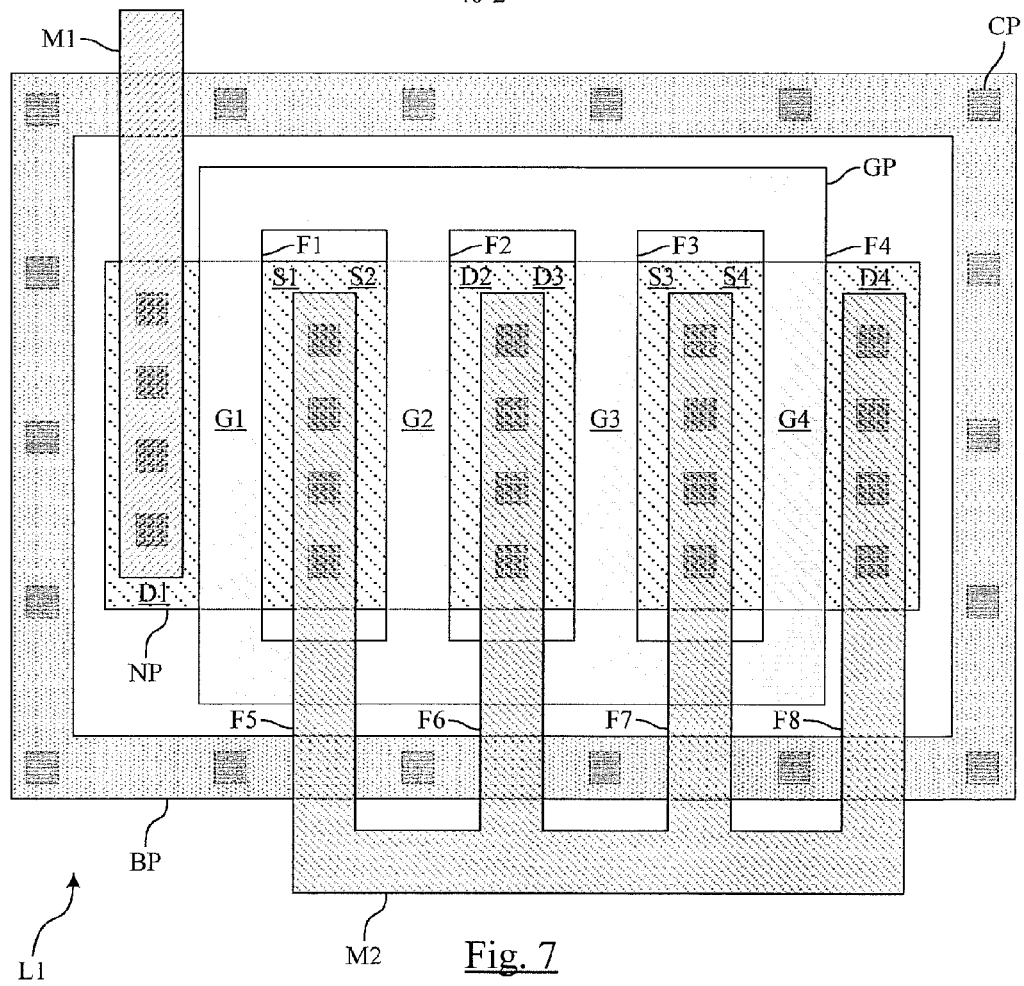
FIG. 7 is a top view of the layout of a test structure, according to an embodiment of the present invention.

FIG. 7 is a top view of a transistor layout L1 corresponding to an embodiment of the test structure of FIG. 3 comprising four transistors TA1, TA2, TA3, TA4 (as TAN). The layout L1 comprises an active polygon NP, a gate polygon GP, a body polygon BP, and two metal polygons M1, M2. The active polygon NP is within a first plane, the gate polygon GP and the body polygon BP are within a second plane above the first, and the metal polygons M1, M2 are within a third plane above the second plane. The first, second, and third planes are separated from each other by dielectric layers, not shown.

The active polygon NP has a rectangular shape and is an n doped silicon region of a p type silicon substrate, forming the source and drain regions of transistors TA1, TA2, TA3, TA4. The layout L1 is of the "multi-finger" type, the gate polygon GP comprising several long thin rectangles or "fingers" F1, F2, F3, F4 of polysilicon material extending across the active polygon NP. Finger F1 forms a gate G1 between a drain D1 and a source S1 of transistor TA1, finger F2 forms a gate G2 between a source S2 and a drain D2 of transistor TA2, finger F3 forms a gate G3 between a drain D3 and a source S3 of transistor TA3, and finger F4 forms a gate G4 between a source S4 and a drain D4 of transistor TA4. The fingers are connected to each other by rectangular polygons at the tops and bottoms.

The body polygon BP is in metal and forms a ring surrounding the active polygon NP and the gate polygon GP. Contacts CP traversing the dielectric layer electrically link the body polygon BP to the substrate, so that a bias voltage may be applied as needed to the substrate. The metal polygon M1 is a rectangular polygon extending vertically across the active polygon NP. The metal polygon M1 also comprises contacts CP traversing the dielectric layer to electrically link polygon M1 to the active polygon NP, forming the connection to the drain D1 of transistor TA1. The metal polygon M2 comprises a first rectangular polygon extending horizontally across the bottom of the layout, and long thin rectangular fingers F5, F6, F7, F8 extending vertically across the active polygon NP. Each finger comprises contacts CP traversing the dielectric layer to electrically link the fingers to the active polygon NP, forming source and drain contacts. Finger F5 forms the connections to sources S1, S2 of transistors TA1, TA2, finger F6 forms the connections to drains D2, D3 of transistors TA2, TA3, finger F7 forms the connections to sources S3, S4 of transistors TA3, TA4, and finger F8 forms the connection to drain D4 of transistor TA4.

The test pads P11, P12, P13, P14, not shown in FIG. 7, are located at an upper layer of metal. Test pad P11 is electrically linked to polygon M1 to provide probe access to drain D1 of transistor TA1. Likewise, test pad P2 is electrically linked to the gate polygon GP to provide probe access to the gates G1, G2, G3, G4 of the transistors. Test pad P13 is electrically linked to the metal polygon M2 to provide probe access to the sources S1, S2, S3, S4 and to the drain D2, D3, D4. Test pad P14 is electrically linked to the body polygon BP to provide probe access to the bodies of the transistors. Thus, the input and output signals for the direct and alternating current testing of the transistors are formed by interconnections which traverse higher dielectric layers to connect the polygons BP, GP, M1, M2 to higher electrical conductors.

It will be understood by the skilled person that test structures according to the present embodiments may be implemented in different manners. For example, in one embodiment, the transistor layout may be a "monofinger" layout, instead of a "multi-finger" layout as shown in FIG. 7.

Figure 8:
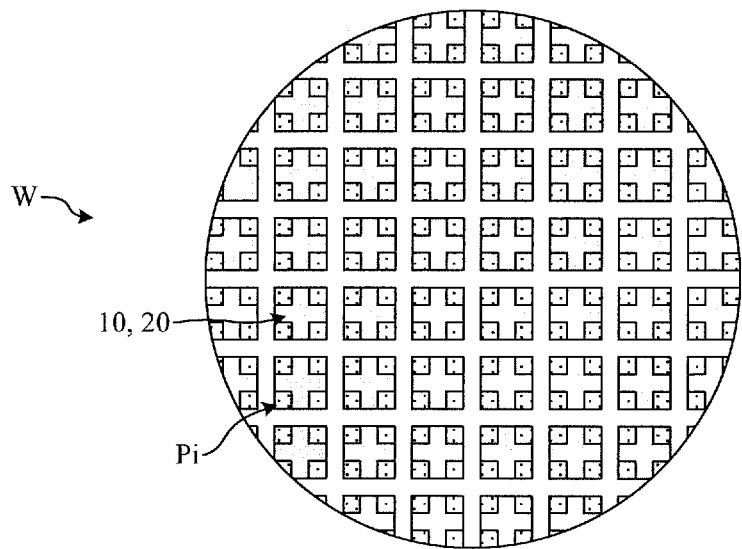
FIG. 8 shows a semiconductor wafer comprising test structures, according to an embodiment of the present invention.

FIG. 8 shows a semiconductor wafer W comprising a plurality of transistor test structures 10 or 20, each comprising a plurality of transistors electrically linked to test pads Pi. The properties of the transistors within each test structure are essentially identical, while they may vary from one test structure to the next. Due to the reduced number of pads per test structure, more structures are able to fit on the semiconductor wafer using pads Pi having typical size and spacing.

Figure 9:
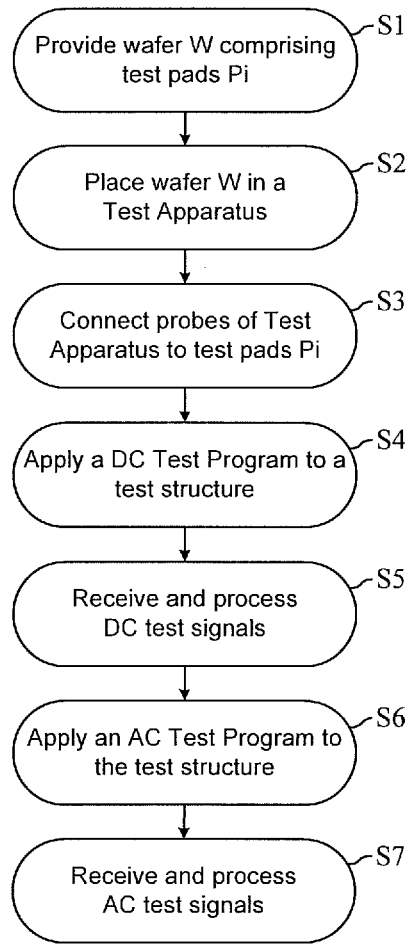
FIG. 9 is a flowchart of a method of characterizing transistors, according to an embodiment of the present invention.

FIG. 9 is a flow chart schematically describing a process for characterizing the properties of a transistor. The process comprises steps S1, S2, ... S7. At step S1, a semiconductor wafer W, such as that shown in FIG. 8, is fabricated. At step S2, the wafer is placed in a test apparatus. At step S3, probe tips of the test apparatus are applied to the test pads Pi of one test structure. At step S4, a DC test program is performed with the test structure through the test pads Pi. At step S5, DC test signals are received by the test apparatus through the test pads. Such test signals may then be digitalized, processed, and/or recorded. At step S6, an AC test program is performed with the test structure. At step S7, AC test signals are received by the test apparatus through the test pads, and may then be digitalized, processed and/or recorded. Steps S3-S7 may then be repeated with another test structure present on the wafer.

In some embodiments, the test apparatus may comprise a capacitance-voltage meter, a voltage meter, a current meter, an AC biasing voltage source, a DC biasing voltage source, a probe card with probe tips, a substrate holder, a processing unit, a display unit, and a user interface. The DC and AC tests may be performed by applying voltages and ground to the terminals of the transistors via the test pads and the probe tips, and measuring electrical signals. For DC tests, a voltage Vgs between the gate and the source, a drain current Id flowing through a channel created between the source and the drain, and a voltage Vds between the drain and source may be measured to determine the functioning of the transistor by applying appropriate values to the test pads. For AC tests, a preselected DC voltage, for example, 15 mV, may be applied, with a superimposed AC signal to measure a gate capacitance. The DC voltage may be varied to measure the current amplitude and phase and obtain a constant capacitance versus voltage measurement for various biasing levels. The AC frequency may be varied from 10 kHz to 10 MHz. A low frequency may be used to determine "quasi-static" characteristics. A high frequency may be used to determine dynamic characteristics. Parasitic capacitance, channel length, mobility, interface traps, substrate doping profile, and oxide thickness may be determined using such tests.

That which is claimed is:

1. A test structure comprising:
a plurality of test pads comprising at least one first test pad, and at least one common test pad;
a direct current (DC) test structure comprising a test transistor, said DC test structure coupled to said at least one first test pad, and said at least one common test pad, and configured to test at least one DC property of said test transistor; and
an alternating current (AC) test structure comprising a plurality of transistors adjacent said test transistor, said AC test structure coupled to said test transistor, and said at least one common test pad, said AC test structure configured to test at least one AC property of said test transistor;
said test transistor and each of said plurality of transistors comprising a control terminal coupled to said at least one common test pad;
said plurality of transistors configured to provide conformity transistors shared by said AC test structure and said DC test structure.

2. The test structure according to claim 1 wherein said test transistor and each of said plurality of transistors comprises a metal oxide semiconductor (MOS) transistor comprising a source terminal, a drain terminal, and a gate terminal; and wherein each MOS transistor of said plurality of transistors has respective source and drain terminals interconnected.

3. The test structure according to claim 1 wherein said test transistor and each of said plurality of transistors comprises a bipolar transistor comprising a collector terminal, a base terminal, and an emitter terminal; and wherein each bipolar transistor of said plurality of transistors has respective collector and emitter terminals interconnected.

4. The test structure according to claim 1 wherein said at least one common test pad comprises a plurality thereof; and wherein said test transistor and each of said plurality of transistors comprises a conduction terminal coupled to another common test pad from said plurality thereof.

5. The test structure according to claim 1 wherein said at least one common test pad comprises a plurality thereof; and wherein said test transistor and each of said plurality of transistors comprises a body terminal coupled to another common test pad from said plurality thereof.

6. A test structure comprising:
a plurality of test pads comprising at least one first test pad, and at least one common test pad;
a direct current (DC) test structure comprising a test transistor, and a first plurality of transistors, said test transistor coupled to said at least one first test pad, and said at least one common test pad, said DC test structure configured to test at least one DC property of said test transistor; and
an alternating current (AC) test structure comprising a second plurality of transistors adjacent said test transistor, said AC test structure coupled to said test transistor, and said at least one common test pad, said AC test structure configured to test at least one AC property of said test transistor;

said test transistor and each of said second plurality of transistors comprising a conduction terminal coupled to said at least one common test pad;

said first plurality of transistors being uncoupled to said at least one common test pad and said at least one first test pad, and configured to provide conformity transistors for said DC test structure.

7. The test structure according to claim 6 wherein said test transistor and each of said second plurality of transistors comprises a metal oxide semiconductor (MOS) transistor comprising a source terminal, a drain terminal, and a gate terminal.

8. The test structure according to claim 6 wherein said at least one common test pad comprises a plurality thereof; and wherein said test transistor and each of said second plurality of transistors comprises a body terminal coupled to another common test pad from said plurality thereof.

9. A semiconductor wafer comprising:
a plurality of semiconductor dies;
at least one of said plurality of semiconductor dies comprising at least one test structure comprising
a plurality of test pads comprising at least one first test pad, and at least one common test pad,
a direct current (DC) test structure comprising a test transistor, said DC test structure coupled to said at least one first test pad, and said at least one common test pad, and configured to test at least one DC property of said test transistor, and
an alternating current (AC) test structure comprising a plurality of transistors adjacent said test transistor, said AC test structure coupled to said test transistor, and said at least one common test pad, said AC test structure configured to test at least one AC property of said test transistor,
said test transistor and each of said plurality of transistors comprising a control terminal coupled to said at least one common test pad,
said plurality of transistors configured to provide conformity transistors shared by said AC test structure and said DC test structure.

10. The semiconductor wafer according to claim 9 wherein said at least one common test pad comprises a plurality thereof; and wherein said test transistor and each of said plurality of transistors comprises a conduction terminal coupled to another common test pad from said plurality thereof.

11. The semiconductor wafer according to claim 9 wherein said at least one common test pad comprises a plurality thereof; and wherein said test transistor and each of said plurality of transistors comprises a body terminal coupled to another common test pad from said plurality thereof.

12. A semiconductor wafer comprising:
a plurality of semiconductor dies;
at least one of said plurality of semiconductor dies comprising at least one test structure comprising
a plurality of test pads comprising at least one first test pad, and at least one common test pad,
a direct current (DC) test structure comprising a test transistor, and a first plurality of transistors, said test transistor coupled to said at least one first test pad, and said at least one common test pad, said DC test structure configured to test at least one DC property of said test transistor, and
an alternating current (AC) test structure comprising a second plurality of transistors adjacent said test transistor, said AC test structure coupled to said test transistor, and said at least one common test pad, said AC test structure configured to test at least one AC property of said test transistor,
said test transistor and each of said second plurality of transistors comprising a conduction terminal coupled to said at least one common test pad,
said first plurality of transistors being uncoupled to said at least one common test pad and said at least one first test pad, and configured to provide conformity transistors for said DC test structure.

13. The semiconductor wafer according to claim 12 wherein said test transistor and each of said second plurality of transistors comprises a metal oxide semiconductor (MOS) transistor comprising a source terminal, a drain terminal, and a gate terminal.

14. The semiconductor wafer according to claim 12 wherein said at least one common test pad comprises a plurality thereof; and wherein said test transistor and each of said first and second plurality of transistors comprises a body terminal coupled to another common test pad from said plurality thereof.

15. A testing method comprising:
coupling a test apparatus to a test structure comprising
a plurality of test pads comprising at least one first test pad, and at least one common test pad,
a direct current (DC) test structure comprising a test transistor, said DC test structure being coupled to the at least one first test pad, and the at least one common test pad, and configured to test at least one DC property of the test transistor, and
an alternating current (AC) test structure comprising a plurality of transistors adjacent the test transistor, the AC test structure coupled to the test transistor, and the at least one common test pad, the AC test structure configured to test at least one AC property of the test transistor,
the test transistor and each of the plurality of transistors comprising a control terminal coupled to the at least one common test pad,
the plurality of transistors providing conformity transistors shared by the AC test structure and the DC test structure; and
operating the test apparatus to apply a DC test program to the test structure, and to apply an AC test program to the test structure.

16. The method according to claim 15 wherein the at least one common test pad comprises a plurality thereof; and wherein the test transistor and each of the plurality of transistors comprises a conduction terminal coupled to another common test pad from the plurality thereof.

17. The method according to claim 15 wherein the at least one common test pad comprises a plurality thereof; and wherein the test transistor and each of the plurality of transistors comprises a body terminal coupled to another common test pad from the plurality thereof.

18. A test method comprising:
coupling a test apparatus to a test structure comprising
a plurality of test pads comprising at least one first test pad, and at least one common test pad,
a direct current (DC) test structure comprising a test transistor, and a first plurality of transistors, said test transistor coupled to the at least one first test pad, and the at least one common test pad, the DC test structure configured to test at least one DC property of the test transistor, and an alternating current (AC) test structure comprising a second plurality of transistors adjacent the test transistor, the AC test structure coupled to the test transistor, and the at least one common test pad, the AC test structure configured to test at least one AC property of the test transistor, the test transistor and each of the second plurality of transistors comprising a conduction terminal coupled to the at least one common test pad, the first plurality of transistors being uncoupled to the at least one common test pad and the at least one first test pad, and configured to provide conformity transistors for the DC test structure; and operating the test apparatus to apply a DC test program to the test structure, and to apply an AC test program to the test structure.

19. The method according to claim 18 wherein the test transistor and each of the second plurality of transistors comprises a metal oxide semiconductor (MOS) transistor comprising a source terminal, a drain terminal, and a gate terminal.

20. The method according to claim 18 wherein the at least one common test pad comprises a plurality thereof; and wherein the test transistor and each of the second plurality of transistors comprises a body terminal coupled to another common test pad from the plurality thereof.

* * * * *